(12) United States Patent
Chen et al.

(10) Patent No.: US 9,299,784 B2
(45) Date of Patent: Mar. 29, 2016

(54) SEMICONDUCTOR DEVICE WITH NON-LINEAR SURFACE

(71) Applicant: Taiwan Semiconductor Manufacturing Company Limited, Hsin-Chu (TW)

(72) Inventors: Xiaomeng Chen, Hsinchu (TW); Zhiqiang Wu, Chubei (TW); Shih-Chang Liu, Alian Township (TW); Chien-Hong Chen, Baoshan Township (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 6 days.

(21) Appl. No.: 14/046,985

(22) Filed: Oct. 6, 2013

(65) Prior Publication Data

US 2015/0097218 A1    Apr. 9, 2015

(51) Int. Cl.
| | |
|---|---|
| *H01L 29/10* | (2006.01) |
| *H01L 29/66* | (2006.01) |
| *H01L 29/78* | (2006.01) |
| *H01L 29/423* | (2006.01) |
| *H01L 29/786* | (2006.01) |
| *H01L 29/04* | (2006.01) |

(52) U.S. Cl.
CPC .......... *H01L 29/1033* (2013.01); *H01L 29/045* (2013.01); *H01L 29/42392* (2013.01); *H01L 29/66772* (2013.01); *H01L 29/66787* (2013.01); *H01L 29/785* (2013.01); *H01L 29/78696* (2013.01)

(58) Field of Classification Search
CPC ............ H01L 29/1033; H01L 29/7856; H01L 29/7853; H01L 29/7854; H01L 29/66787–29/66818
USPC ................................... 438/198, 284; 256/401
IPC ...................... H01L 29/7853, 29/7854, 29/7856
See application file for complete search history.

(56) References Cited

U.S. PATENT DOCUMENTS

| | | | | | |
|---|---|---|---|---|---|
| 4,893,156 | A | * | 1/1990 | Karasawa ..................... | 257/401 |
| 5,578,513 | A | * | 11/1996 | Maegawa ...................... | 438/151 |
| 7,045,407 | B2 | * | 5/2006 | Keating et al. ............... | 438/198 |
| 7,674,667 | B2 | * | 3/2010 | Zhu ............................... | 438/198 |
| 8,071,983 | B2 | * | 12/2011 | Brask et al. .................... | 257/66 |
| 8,405,155 | B2 | * | 3/2013 | Yeh et al. ...................... | 257/369 |
| 8,664,056 | B2 | * | 3/2014 | Wirbeleit et al. ............. | 438/198 |
| 2006/0046452 | A1 | * | 3/2006 | Rios et al. ..................... | 438/595 |
| 2006/0049429 | A1 | * | 3/2006 | Kim et al. ..................... | 257/213 |

(Continued)

OTHER PUBLICATIONS

Han, Kyoung-Rok "Design of Bulk Fin-Type Field-Effect Transistor Considering Gate Work-Function" Jap. Jour. Of App. Phys. vol. 47, No. 6, Jun. 2008 pp. 4385-4391.*

*Primary Examiner* — Matthew Landau
*Assistant Examiner* — Grant Withers
(74) *Attorney, Agent, or Firm* — Cooper Legal Group, LLC

(57) ABSTRACT

A semiconductor device includes a first channel having a first linear surface and a first non-linear surface. The semiconductor device includes a first dielectric region surrounding the first channel. The semiconductor device includes a second channel having a third linear surface and a third non-linear surface. The semiconductor device includes a second dielectric region surrounding the second channel. The semiconductor device includes a gate electrode surrounding the first dielectric region and the second dielectric region.

20 Claims, 17 Drawing Sheets

(56) References Cited

U.S. PATENT DOCUMENTS

| | | | |
|---|---|---|---|
| 2006/0065937 A1* | 3/2006 | Hoffmann et al. | 257/401 |
| 2006/0086977 A1* | 4/2006 | Shah et al. | 257/347 |
| 2007/0001173 A1* | 1/2007 | Brask et al. | 257/67 |
| 2009/0061610 A1* | 3/2009 | Ono | 438/591 |
| 2009/0218603 A1* | 9/2009 | Brask et al. | 257/255 |
| 2009/0283829 A1* | 11/2009 | Dyer et al. | 257/351 |
| 2010/0068862 A1* | 3/2010 | Lee et al. | 438/308 |
| 2010/0270619 A1* | 10/2010 | Lee | 257/365 |
| 2011/0049567 A1* | 3/2011 | Peng et al. | 257/190 |
| 2011/0062512 A1* | 3/2011 | Shah et al. | 257/327 |
| 2011/0070703 A1* | 3/2011 | Xiong et al. | 438/231 |
| 2011/0183481 A1* | 7/2011 | Dyer | 438/198 |
| 2011/0291190 A1* | 12/2011 | Xiao et al. | 257/347 |
| 2012/0012934 A1* | 1/2012 | Shah et al. | 257/347 |
| 2012/0032237 A1* | 2/2012 | Brask et al. | 257/255 |
| 2012/0199888 A1* | 8/2012 | Dai et al. | 257/288 |
| 2012/0256279 A1* | 10/2012 | Wu et al. | 257/412 |
| 2012/0299058 A1* | 11/2012 | Huang et al. | 257/190 |
| 2012/0302018 A1* | 11/2012 | Shin et al. | 438/198 |
| 2012/0319166 A1* | 12/2012 | Adam et al. | 257/192 |
| 2012/0319178 A1* | 12/2012 | Chang et al. | 257/287 |
| 2013/0001660 A1* | 1/2013 | Dyer | 257/288 |
| 2013/0045576 A1* | 2/2013 | Tsai et al. | 438/151 |
| 2013/0049068 A1* | 2/2013 | Lin et al. | 257/192 |
| 2013/0056795 A1* | 3/2013 | Wu et al. | 257/191 |
| 2013/0084682 A1* | 4/2013 | Lee et al. | 438/198 |
| 2013/0109152 A1* | 5/2013 | Huang et al. | 438/430 |
| 2013/0122698 A1* | 5/2013 | Liao et al. | 438/585 |
| 2013/0175585 A1* | 7/2013 | Tan et al. | 257/288 |
| 2013/0193490 A1* | 8/2013 | Yin et al. | 257/255 |
| 2013/0200483 A1* | 8/2013 | Tung | 257/506 |
| 2013/0264642 A1* | 10/2013 | Shah et al. | 257/347 |
| 2013/0270612 A1* | 10/2013 | Chien et al. | 257/288 |
| 2013/0285129 A1* | 10/2013 | Jensen et al. | 257/288 |
| 2013/0334606 A1* | 12/2013 | Shen et al. | 257/368 |
| 2014/0035009 A1* | 2/2014 | Brask et al. | 257/255 |
| 2014/0097506 A1* | 4/2014 | Liaw | 257/410 |
| 2014/0117418 A1* | 5/2014 | Flachowsky et al. | 257/288 |
| 2014/0225197 A1* | 8/2014 | Huang et al. | 257/347 |
| 2014/0239358 A1* | 8/2014 | Shah et al. | 257/288 |
| 2014/0252412 A1* | 9/2014 | Tsai et al. | 257/192 |
| 2014/0264279 A1* | 9/2014 | Cheng et al. | 257/27 |

* cited by examiner

SEMICONDUCTOR DEVICE WITH NON-LINEAR SURFACE

BACKGROUND

A gate-all-around (GAA) type MOS transistor includes a channel region surrounded by a gate electrode. The presence of the gate electrode around more than one side or surface of the channel region allows the gate electrode to exercise more control over the channel region, or rather more control over current flowing through the channel region between a source region and a drain region of the transistor.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

One or more techniques, and resulting structures, for forming a semiconductor device are provided herein.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
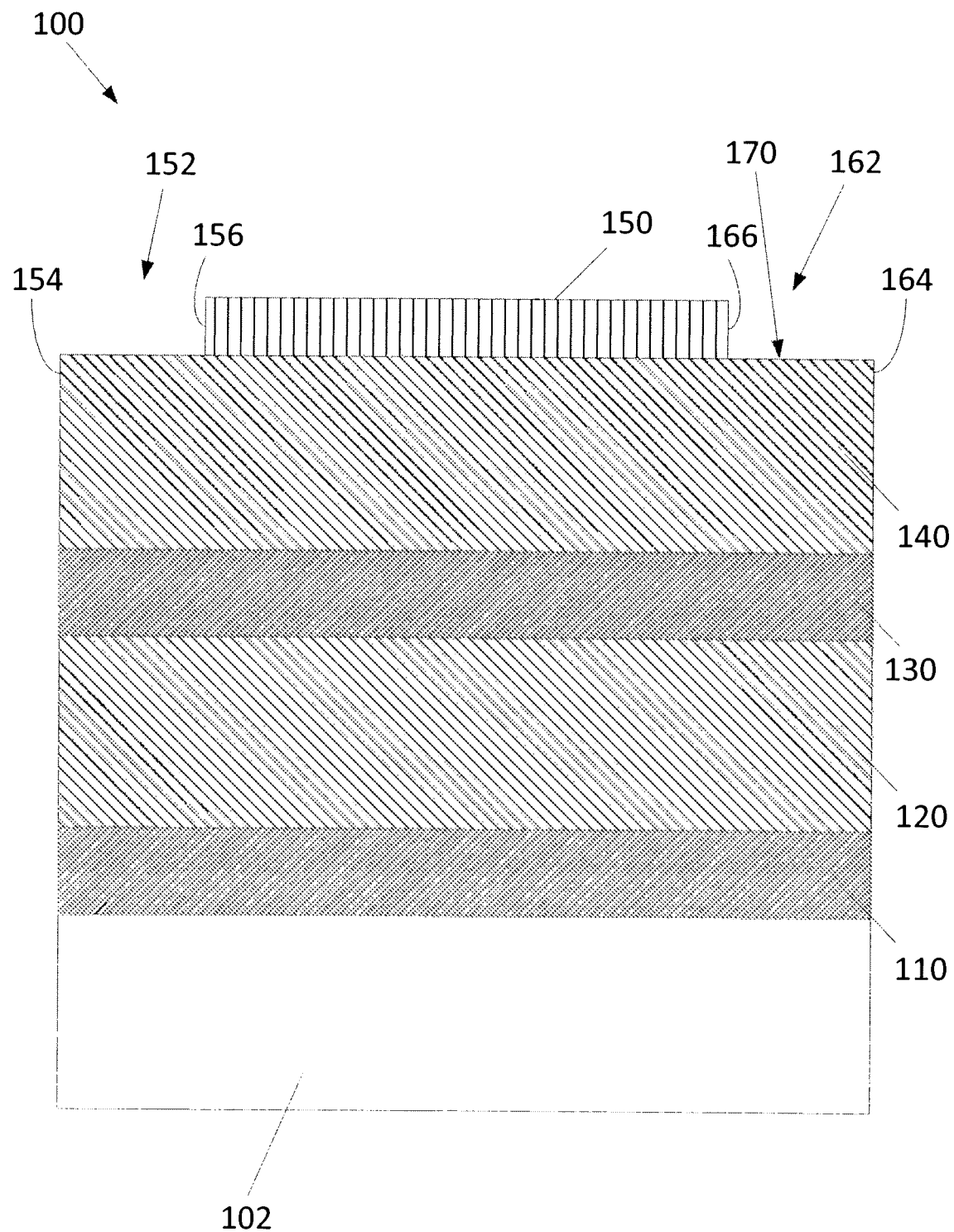
FIG. 1 illustrates a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a sectional view illustrating a semiconductor device 100 according to some embodiments. In an embodiment, the semiconductor device 100 is formed upon a substrate 102. The substrate 102 comprises any number of materials, such as, for example, silicon, germanium, etc., alone or in combination. According to some embodiments, the substrate 102 comprises an epitaxial layer, a silicon-on-insulator (SOI) structure, etc. According to some embodiments, the substrate 102 corresponds to a wafer or a die formed from a wafer.

According to some embodiments, the semiconductor device 100 comprises one or more layers. In some embodiments, the semiconductor device 100 includes a first layer 110. In an embodiment, the first layer 110 is formed upon the substrate 102. The first layer 110 comprises any number of materials, such as, for example, silicon germanium, etc. According to some embodiments, the first layer 110 is formed by deposition, epitaxial growth, etc. In an embodiment, the first layer 110 functions as a barrier layer, stopping layer or etch stop layer (ESL).

According to some embodiments, the semiconductor device 100 comprises one or more substrate layers. In some embodiments, the semiconductor device 100 includes a first substrate layer 120. In an embodiment, the first substrate layer 120 is formed upon the first layer 110. The first substrate layer 120 comprises any number of materials, such as, for example, silicon, germanium, etc., alone or in combination. According to some embodiments, the first substrate layer 120 comprises the same material as the substrate 102. In some embodiments, the first substrate layer 120 is formed by deposition, epitaxial growth, etc.

According to some embodiments, the semiconductor device 100 includes a second layer 130. In an embodiment, the second layer 130 is formed upon the first substrate layer 120. The second layer 130 comprises any number of materials, such as, for example, silicon germanium, etc. According to some embodiments, the second layer 130 comprises the same material as the first layer 110. In some embodiments, the second layer 130 is formed by deposition, epitaxial growth, etc. In an embodiment, the second layer 130 functions as a barrier layer, stopping layer or etch stop layer (ESL).

According to some embodiments, the semiconductor device 100 includes a second substrate layer 140. In an embodiment, the second substrate layer 140 is formed upon the second layer 130. The second substrate layer 140 comprises any number of materials, such as, for example, silicon, germanium, etc., alone or in combination. According to some embodiments, the second substrate layer 140 comprises the same material as the substrate 102. According to some embodiments, the second substrate layer 140 comprises the same material as the first substrate layer 120. In some embodiments, the second substrate layer 140 is formed by deposition, epitaxial growth, etc.

According to some embodiments, a mask layer 150 is formed over the second substrate layer 140. The mask layer 150 includes any number of materials, including silicon oxide, silicon nitride, nitride, etc., alone or in combination. In some embodiments, the mask layer 150 extends across the entire second substrate layer 140.

In some embodiments, one or more openings are formed in the mask layer 150. In an embodiment, a first mask opening 152 is formed in the mask layer 150, such as by etching, for example. In an embodiment, the first mask opening 152 is formed between a first device end 154 and a first mask end 156. In some embodiments, a second mask opening 162 is formed in the mask layer 150, such as by etching, for example. In an embodiment, the second mask opening 162 is formed between a second device end 164 and a second mask end 166. In some embodiments, the first mask opening 152 and second mask opening 162 are formed to an upper edge or top surface 170 of the second substrate layer 140.

Figure 2:
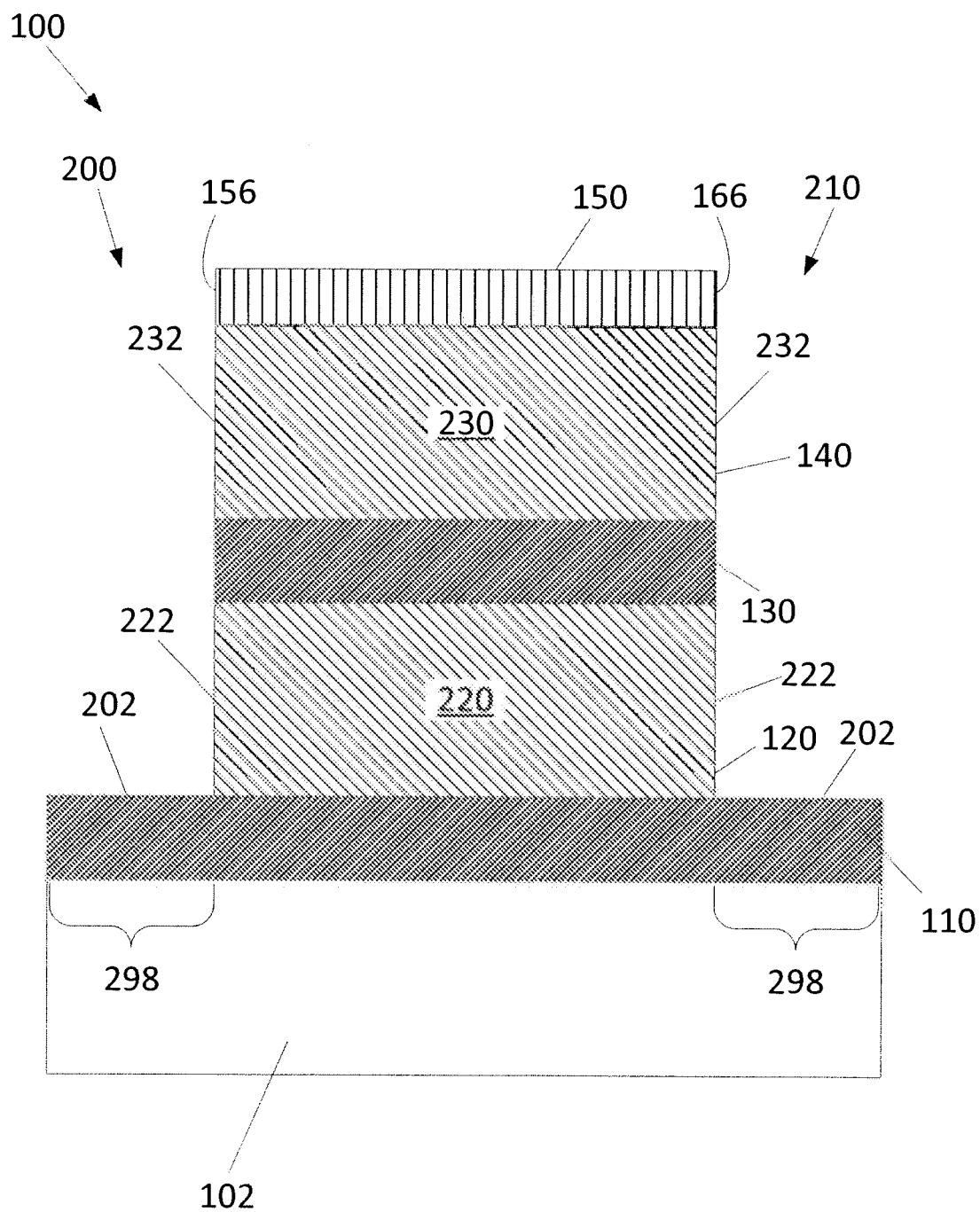
FIG. 2 illustrates a portion of a semiconductor device, according to an embodiment.

Turning to FIG. 2, in an embodiment, a portion of the semiconductor device 100 is removed, such as by dry or wet etching, for example, to form one or more openings. In an embodiment, a first opening 200 is formed by removing a portion of the first substrate layer 120, second layer 130, and the second substrate layer 140 below the first mask opening 152 (illustrated in FIG. 1). In some embodiments, the first opening 200 is formed to an upper edge or top surface 202 of the first layer 110. In an embodiment, the etch chemistry for etching through the first substrate layer 120 and the second substrate layer 140 includes chlorine, hydrogen bromide, etc., alone or in combination. In an embodiment, the etch chemistry for etching through the second layer 130 includes boron trichloride, argon, etc., alone or in combination.

In an embodiment, a second opening 210 is formed by removing a portion of the first substrate layer 120, second layer 130, and the second substrate layer 140 below the second mask opening 162 (illustrated in FIG. 1). In some embodiments, the second opening 210 is formed to the upper edge or top surface 202 of the first layer 110. In an embodiment, the etch chemistry for etching through the first substrate layer 120 and the second substrate layer 140 includes chlorine, hydrogen bromide, etc., alone or in combination. In an embodiment, the etch chemistry for etching through the second layer 130 includes boron trichloride, argon, etc., alone or in combination.

In some embodiments, a first channel 220 is formed between the first opening 200 and the second opening 210. In an embodiment, the first channel 220 is disposed below the second layer 130 and above the first layer 110. In some embodiments, after the formation of the first opening 200 and the second opening 210, the first channel 220 includes first channel walls 222 that are substantially linear. In some embodiments, a second channel 230 is formed adjacent the first channel 220 between the first opening 200 and the second opening 210. In an embodiment, the second channel 230 is disposed below the mask layer 150 and above the second layer 130. In some embodiments, after the formation of the first opening 200 and the second opening 210, the second channel 230 includes second channel walls 232 that are substantially linear.

Figure 3:
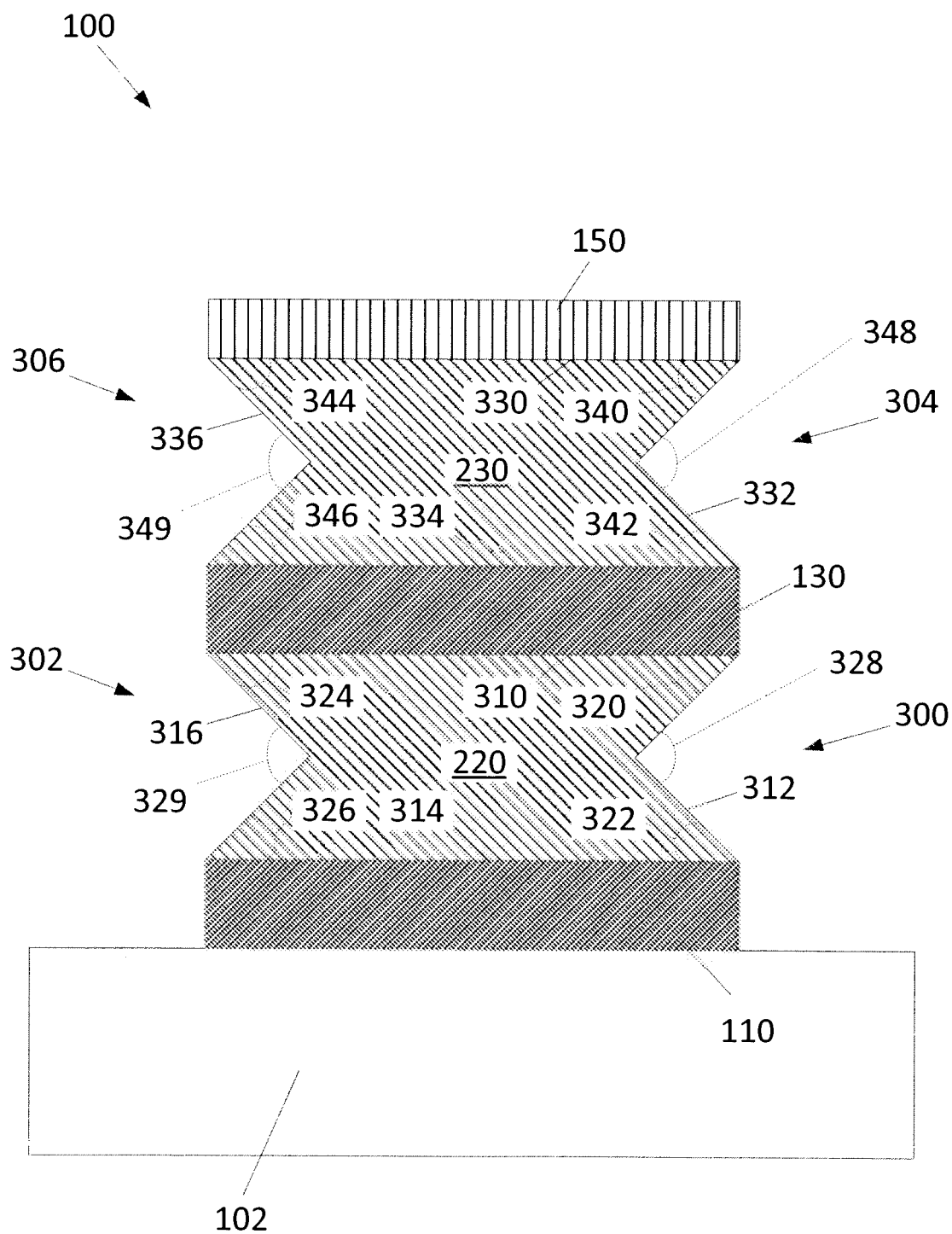
FIG. 3 illustrates forming a first channel and a second channel associated with forming a semiconductor device, according to an embodiment.

Turning to FIG. 3, in an embodiment, the first channel 220 and the second channel 230 are patterned. In an embodiment, the first channel 220 is patterned to form a first channel opening 300 and a second channel opening 302. In an embodiment, the second channel 230 is patterned to form a third channel opening 304 and a fourth channel opening 306. In some embodiments, the channel openings 300, 302, 304, 306 are formed in the first channel 220 and second channel 230 by wet etching. In some embodiments, the wet etch chemistry includes tetramethylammonium hydroxide (TMAH), tetraethylammonium hydroxide (TEAH), ammonium hydroxide ($NH_4OH$), etc., alone or in combination. According to some embodiments, the wet etch chemistry selectively etches the first channel walls 222 and second channel walls 232 (illustrated in FIG. 2), while substantially not etching the first layer 110 or the second layer 130. In an embodiment, this etching will form the first channel opening 300 and second channel opening 302 in the first channel 220 and the third channel opening 304 and the fourth channel opening 306 in the second channel 230.

According to some embodiments, the first channel 220 comprises a first linear surface 310. In an embodiment, the first linear surface 310 extends substantially parallel to the top surface 202 (illustrated in FIG. 2) of the first layer 110. In some embodiments, the first linear surface 310 is formed adjacent to and under the second layer 130. In some embodiments, the first channel 220 comprises a first non-linear surface 312. In an embodiment, the first non-linear surface 312 includes the first channel opening 300.

According to some embodiments, the first channel 220 comprises a second linear surface 314. In an embodiment, the second linear surface 314 extends substantially parallel to the top surface 202 of the first layer 110 and to the first linear surface 310. In some embodiments, the second linear surface 314 is formed adjacent to and above the first layer 110. According to some embodiments, the second linear surface 314 is substantially diametrically opposed to the first linear surface 310.

In some embodiments, the first channel 220 comprises a second non-linear surface 316. In an embodiment, the second non-linear surface 316 includes the second channel opening 302. According to some embodiments, the second non-linear surface 316 is substantially diametrically opposed to the first non-linear surface 312. According to some embodiments, the first non-linear surface 312 defines a first angle 320 relative to the first linear surface 310 and a second angle 322 relative to the second linear surface 314 of the first channel 220. In some embodiments, the first angle 320 is about 40 degrees to about 50 degrees. In some embodiments, the second angle 322 is about 40 degrees to about 50 degrees. According to some embodiments, the second non-linear surface 316 defines a third angle 324 relative to the first linear surface 310 and a fourth angle 326 relative to the second linear surface 314 of the first channel 220. In some embodiments, the third angle 324 is about 40 degrees to about 50 degrees. In some embodiments, the fourth angle 326 is about 40 degrees to about 50 degrees. In some embodiments, the first non-linear surface 312 defines a first external angle 328 of about 80 degrees to about 100 degrees. In some embodiments, the second non-linear surface 316 defines a second external angle 329 of about 80 degrees to about 100 degrees.

According to some embodiments, the second channel 230 comprises a third linear surface 330. In an embodiment, the third linear surface 330 extends substantially parallel to the mask layer 150. In an embodiment, the first linear surface 310 of the first channel 220 is substantially parallel to the third linear surface 330 of the second channel 230. In some embodiments, the third linear surface 330 is formed adjacent to and under the mask layer 150. In some embodiments, the second channel 230 comprises a third non-linear surface 332. In an embodiment, the third non-linear surface 332 includes the third channel opening 304.

According to some embodiments, the second channel 230 comprises a fourth linear surface 334. In an embodiment, the fourth linear surface 334 extends substantially parallel to the second layer 130. In some embodiments, the fourth linear surface 334 is formed adjacent to and above the second layer 130. According to some embodiments, the fourth linear surface 334 is substantially diametrically opposed to the third linear surface 330. In some embodiments, the second channel 230 comprises a fourth non-linear surface 336. In an embodiment, the fourth non-linear surface 336 includes the fourth channel opening 306. According to some embodiments, the fourth non-linear surface 336 is substantially diametrically opposed to the third non-linear surface 332.

According to some embodiments, the third non-linear surface 332 defines a fifth angle 340 relative to the third linear surface 330 and a sixth angle 342 relative to the fourth linear surface 334 of the second channel 230. In some embodiments, the fifth angle 340 is about 40 degrees to about 50 degrees. In some embodiments, the sixth angle 342 is about 40 degrees to about 50 degrees. According to some embodiments, the fourth non-linear surface 336 defines a seventh angle 344 relative to the third linear surface 330 and an eighth angle 346 relative to the fourth linear surface 334 of the second channel 230. In some embodiments, the seventh angle 344 is about 40 degrees to about 50 degrees. In some embodiments, the eighth angle 346 is about 40 degrees to about 50 degrees. In some embodiments, the third non-linear surface 332 defines a third external angle 348 of about 80 degrees to about 100 degrees. In some embodiments, the fourth non-linear surface 336 defines a fourth external angle 349 of about 80 degrees to about 100 degrees. According to some embodiments, although the FIGS illustrate sharp or pointed edges, corners, etc., such as defining angles 320, 322, 324, 326, 340, 342, 344, 346, 328, 329, 348, 349, etc., that such edges, corners, etc. may be somewhat rounded, blunted, beveled, etc. when the semiconductor device 100 is fabricated. According to some embodiments, at least some of the angles described herein nevertheless persist to the angular ranges described herein when the semiconductor device 100 is fabricated.

In some embodiments, the first non-linear surface 312 comprises a {111} surface crystal orientation. In some embodiments, the second non-linear surface 316 comprises a {111} surface crystal orientation. In some embodiments, the third non-linear surface 332 comprises a {111} surface crystal orientation. In some embodiments, the fourth non-linear surface 336 comprises a {111} surface crystal orientation. According to some embodiments, the {111} surface crystal orientation provides improved channel mobility through the first channel 220 and the second channel 230. As such, in some embodiments, the {111} surface crystal orientation provides improved performance of the semiconductor device 100. According to some embodiments, at least some of the surfaces described herein as comprising a {111} surface crystal orientation comprise a surface crystal orientation that deviates at least slightly from a {111} surface crystal orientation, but improved performance of the semiconductor device 100 is nevertheless attained despite such deviation(s).

According to some embodiments, after the first channel 220 and second channel 230 are formed, the mask layer 150 is removed. In an embodiment, the mask layer is removed by etching. In some embodiments, a phosphorous material, such as a hot phosphorous material, is used to remove the mask layer 150. In some embodiments, after the channel openings 300, 302, 304, 306 are formed in the first channel 220 and second channel 230, uncovered portions 298 (illustrated in FIG. 2) of the first layer 110 that are not covered by the first channel 220 are removed. According to some embodiments, the uncovered portions 298 are removed by etching, such as with $BCl_3$, Ar, high powered etching, etc., alone or in combination.

Figure 4:
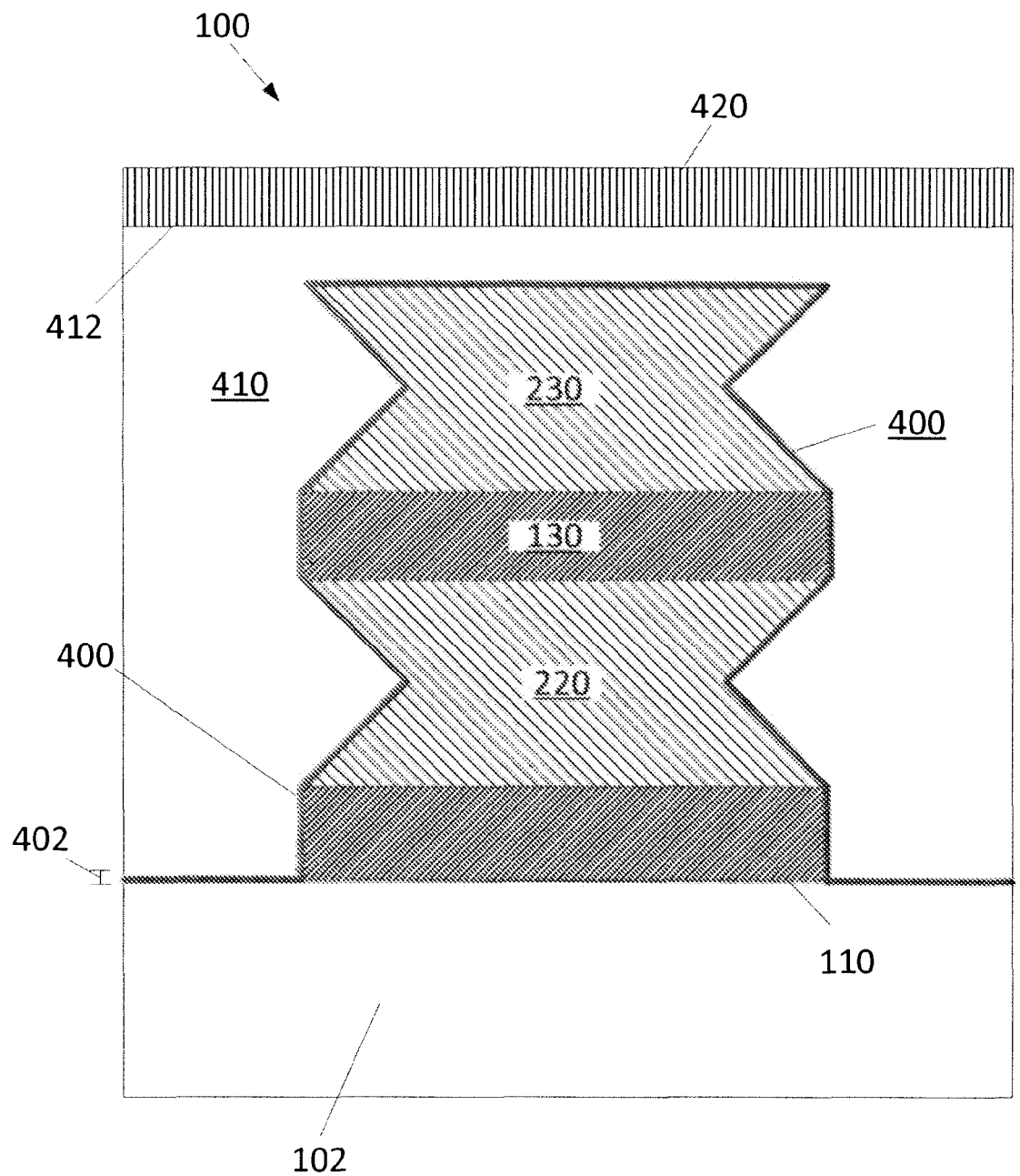
FIG. 4 illustrates a portion of a semiconductor device, according to an embodiment.

Turning to FIG. 4, in an embodiment, a dielectric layer 400 is formed over the first channel 220, second channel 230, substrate 102, first layer 110 and second layer 130 of the semiconductor device 100. The dielectric layer 400 is formed in any number of ways, such as by atomic layer deposition (ALD), or other suitable techniques, for example. The dielectric layer 400 comprises any number of materials, including, for example, oxides, silicon dioxide, etc., alone or in combination. In some embodiments, the dielectric layer 400 comprises a thickness 402 of about 20 angstroms to about 40 angstroms.

In an embodiment, a polysilicon layer 410 is formed over the dielectric layer 400. The polysilicon layer 410 is formed in any number of ways, such as by deposition, for example. According to some embodiments, the polysilicon layer 410 comprises silicon, polysilicon, etc. alone or in combination. In some embodiments, an upper surface 412 of the polysilicon layer 410 has a generally planar shape. According to some embodiments, following the formation of the polysilicon layer 410, the upper surface 412 is planarized, such as by a chemical mechanical polishing (CMP) process.

In an embodiment, a mask layer 420 is formed over the polysilicon layer 410. In some embodiments, the mask layer 420 is formed by deposition, for example. According to some embodiments, the mask layer 420 is formed over the upper surface 412 of the polysilicon layer 410. According to some embodiments, the mask layer 420 includes any number of materials, including oxides, silicon oxide, silicon nitride, etc., alone or in combination.

Figure 5A:
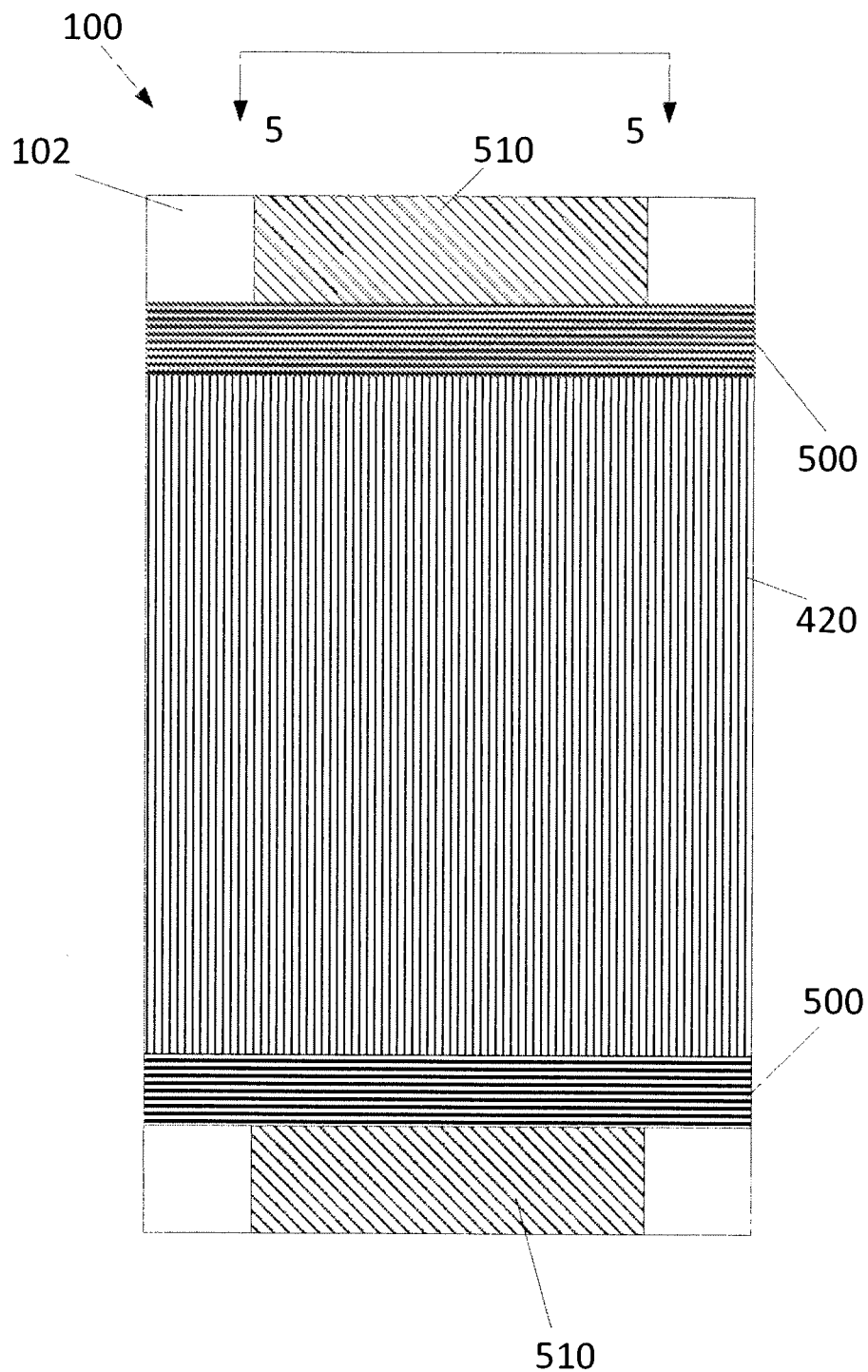
FIG. 5a illustrates a portion of a semiconductor device, according to an embodiment.
Figure 5B:
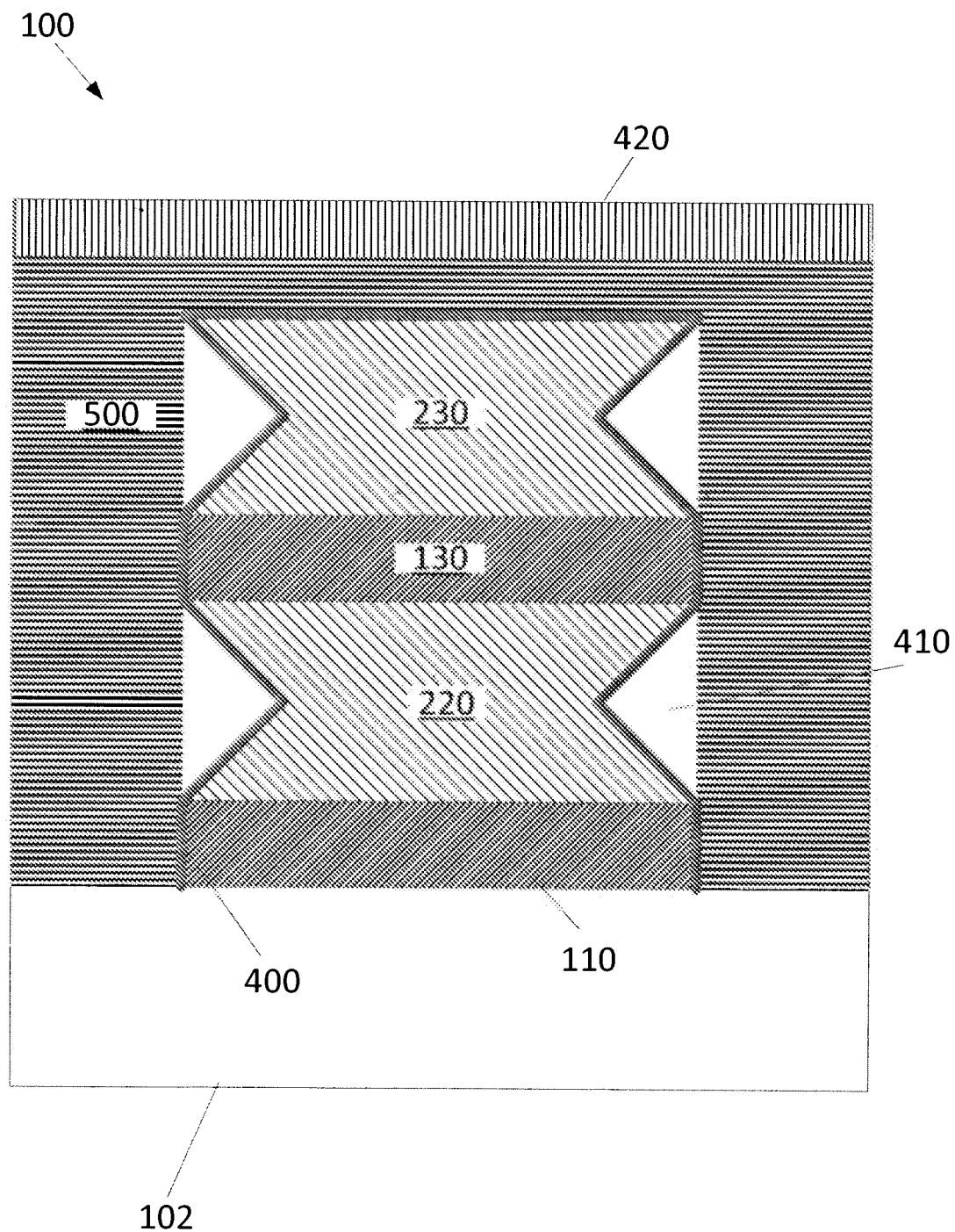
FIG. 5b illustrates a portion of a semiconductor device, according to an embodiment.
Figure 5C:
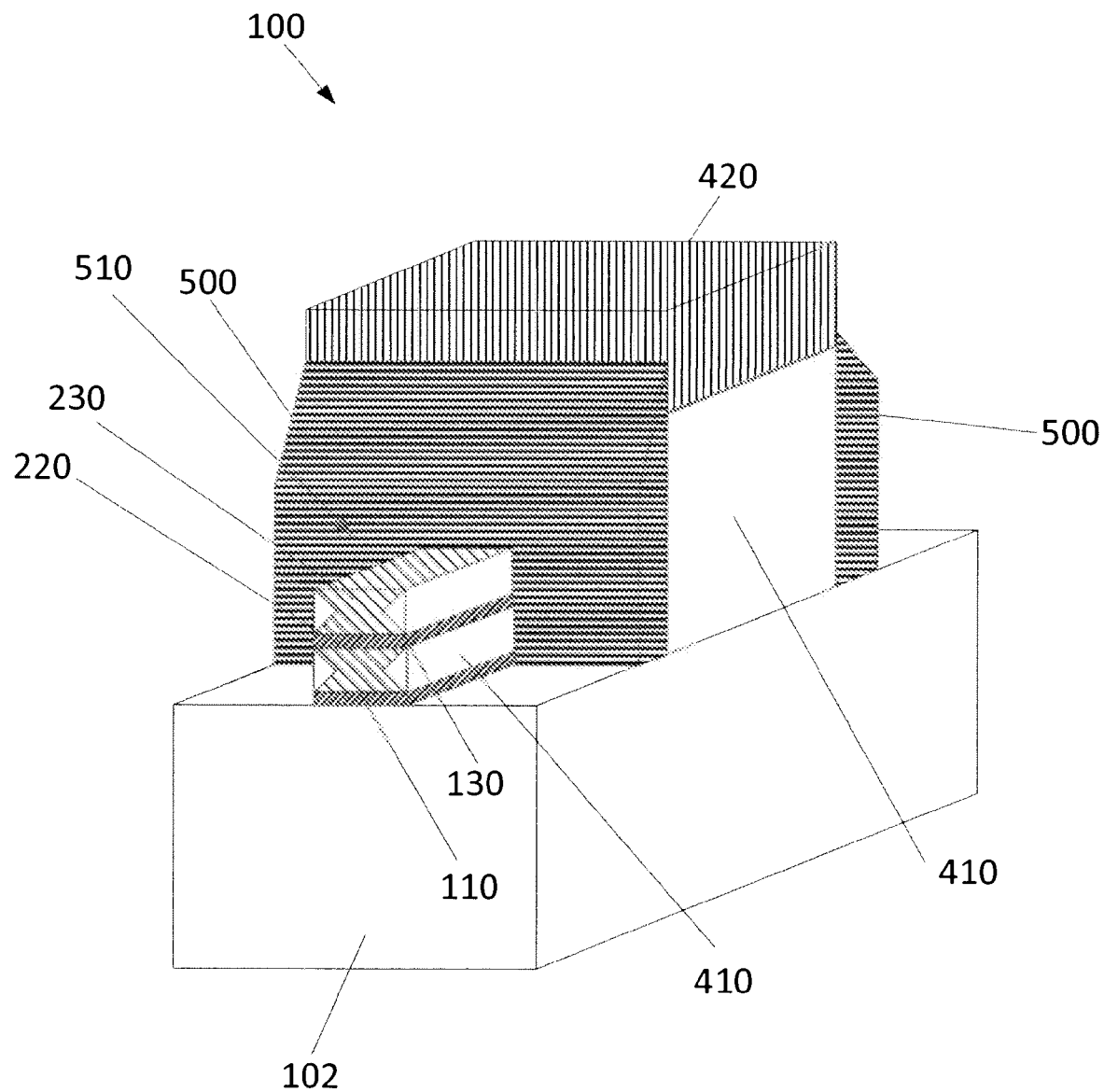
FIG. 5c illustrates a portion of a semiconductor device, according to an embodiment.

FIG. 5a is a plan view illustrating an example of the semiconductor device 100, FIG. 5b is a sectional view looking in to the embodiment of FIG. 5a from a perspective indicated by line 5-5, and FIG. 5c is a perspective view of the semiconductor device 100. In an embodiment, one or more spacers 500 are formed, such as by deposition and etching. According to some embodiments, the spacers 500 are formed at ends of the mask layer 420. In some embodiments, the spacers 500 cover some but not all of the first channel 220 and the second channel 230, such that channel portions 510 at ends of the semiconductor device 100 are not covered by the spacers 500. According to some embodiments, the spacers 500 include any number of materials, including nitrides, polynitrides, etc., alone or in combination.

According to some embodiments, the dielectric layer 400, polysilicon layer 410, and mask layer 420 are removed from channel portions 510. In some embodiments, the channel portions 510 comprise the first channel 220 and the second channel 230. The dielectric layer 400, polysilicon layer 410, and mask layer 420 are removed from channel portions 510 in any number of ways, such as by a timed etch, for example. In some embodiments, the dielectric layer 400 is removed with tetrafluoromethane. In some embodiments, the polysilicon layer 410 is removed with chlorine, hydrogen bromide, etc., alone or in combination. In an embodiment, after the dielectric layer 400, polysilicon layer 410, and mask layer 420 are removed from channel portions 510, the channel portions 510 extend outwardly from the spacers 500.

According to some embodiments, given that FIG. 5b looks in to the end of the embodiment of FIG. 5a, the substrate 102, a portion of the first layer 110 under the first channel 220, the first channel 220, the second layer 130, and the second channel 230 extend out of the page more than spacer 500 and mask layer 420. According to some embodiments, the portion of the first layer 110 under the first channel 220 has a width substantially equal to a width of the first channel 220. According to some embodiments, a portion of the first layer 110 under the mask layer 420 as well as under the first channel 220 has a width substantially equal to a width of the mask layer 420. According to some embodiments, spacer 500 extends out of the page more than the mask layer 420.

Figure 6A:
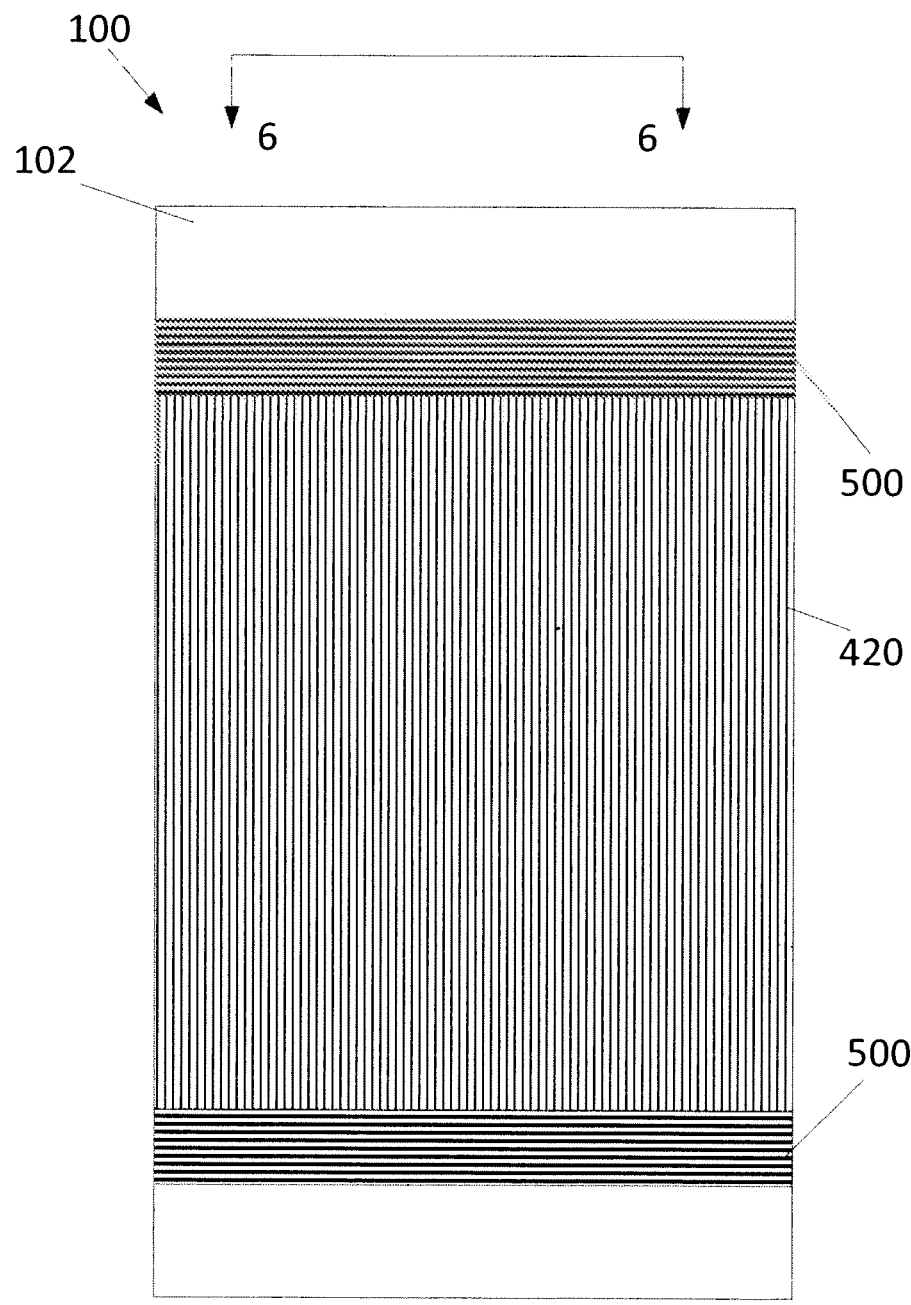
FIG. 6a illustrates a portion of a semiconductor device, according to an embodiment.

FIG. 6a is a plan view illustrating an example of the semiconductor device 100 after the channel portions 510 are removed, such as by dry etching, wet etching, etc. In some embodiments, the channel portions 510 are removed from the spacers 500 to ends of the semiconductor device 100.

Figure 6B:
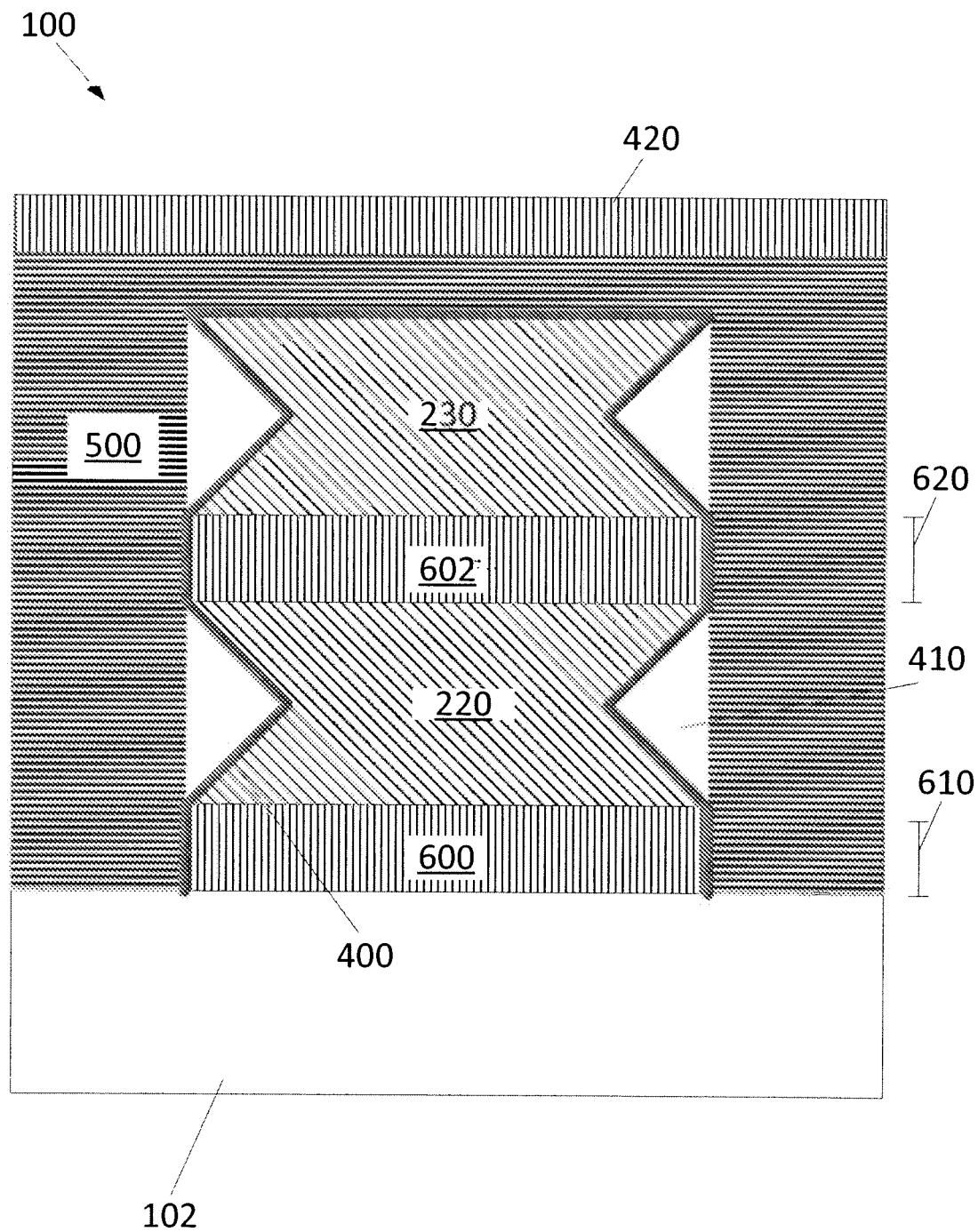
FIG. 6b illustrates a portion of a semiconductor device, according to an embodiment.
Figure 6C:
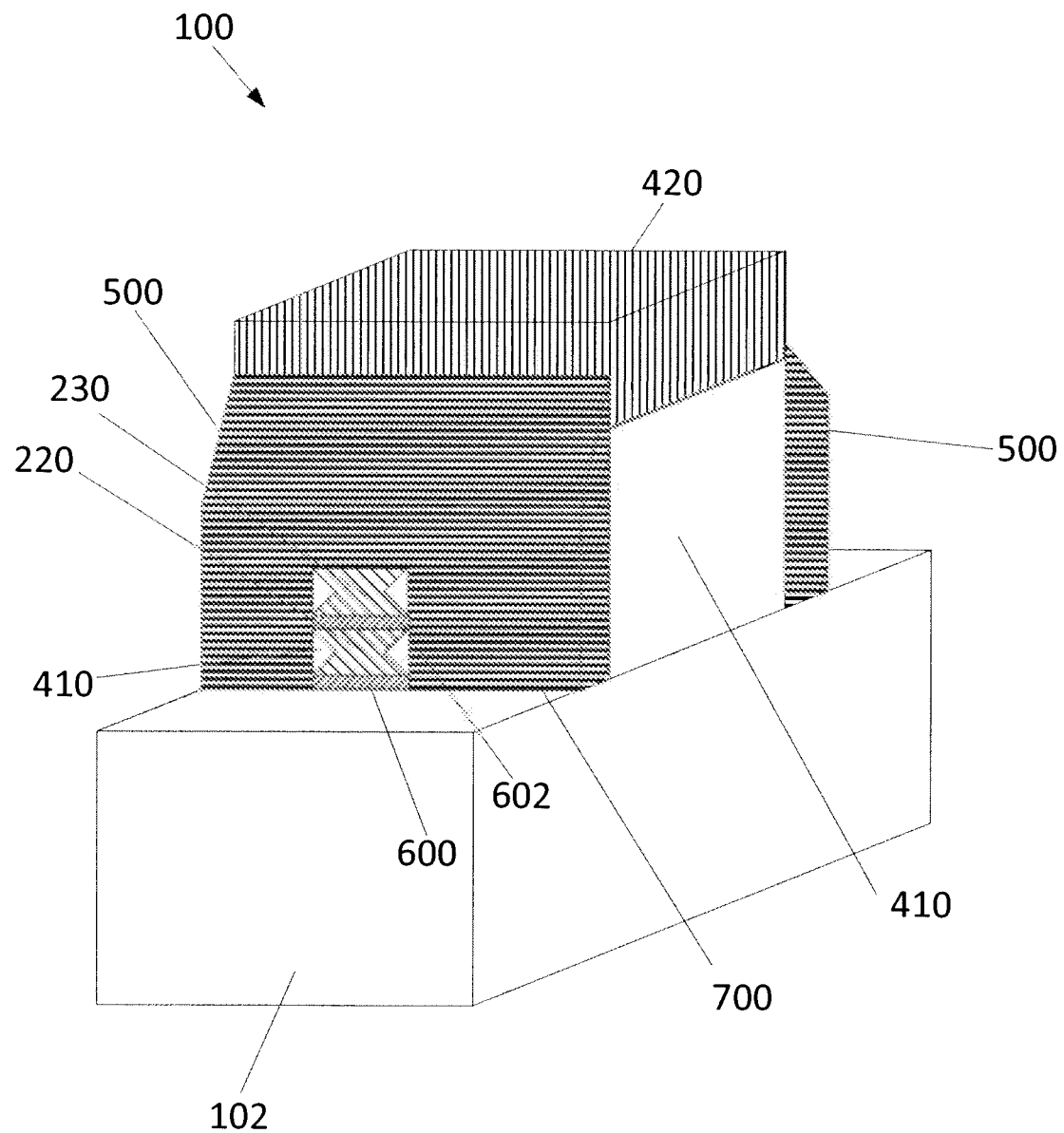
FIG. 6c illustrates a portion of a semiconductor device, according to an embodiment.

FIG. 6b is a sectional view looking in to the embodiment of FIG. 6a from a perspective indicated by line 6-6, and FIG. 6c is a perspective view illustrating the semiconductor device 100. In an embodiment, the first layer 110 and the second layer 130 are removed. According to some embodiments, the first layer 110 and the second layer 130 are removed by isotropic etching with a hydrogen chloride vapor. In some embodiments, after the first layer 110 and the second layer 130 have been removed, a first spacer layer 600 and second spacer layer 602 are formed to replace the first layer 110 and the second layer 130, respectively. The first spacer layer 600 and second spacer layer 602 are formed in any number of ways. In some embodiments, the first spacer layer 600 and second spacer layer 602 are formed by a flowable chemical vapor deposition (CVD) process including oxide, silicon dioxide, tetraethylorthosilicate (TEOS), etc., alone or in combination. In an embodiment, the first spacer layer 600 has a thickness 610 of about 50 angstroms to about 100 angstroms. In an embodiment, the second spacer layer 602 has a thickness 620 of about 50 angstroms to about 100 angstroms.

According to some embodiments, given that FIG. 6b looks in to the end of the embodiment of FIG. 6a, the substrate 102, the first spacer layer 600, the first channel 220, the second spacer layer 602, and the second channel 230 extend out of the page more than the mask layer 420. According to some embodiments, the first spacer layer 600 has a width substantially equal to a width of the first channel 220. According to some embodiments, spacer 500 extends out of the page more than the mask layer 420.

Figure 7:
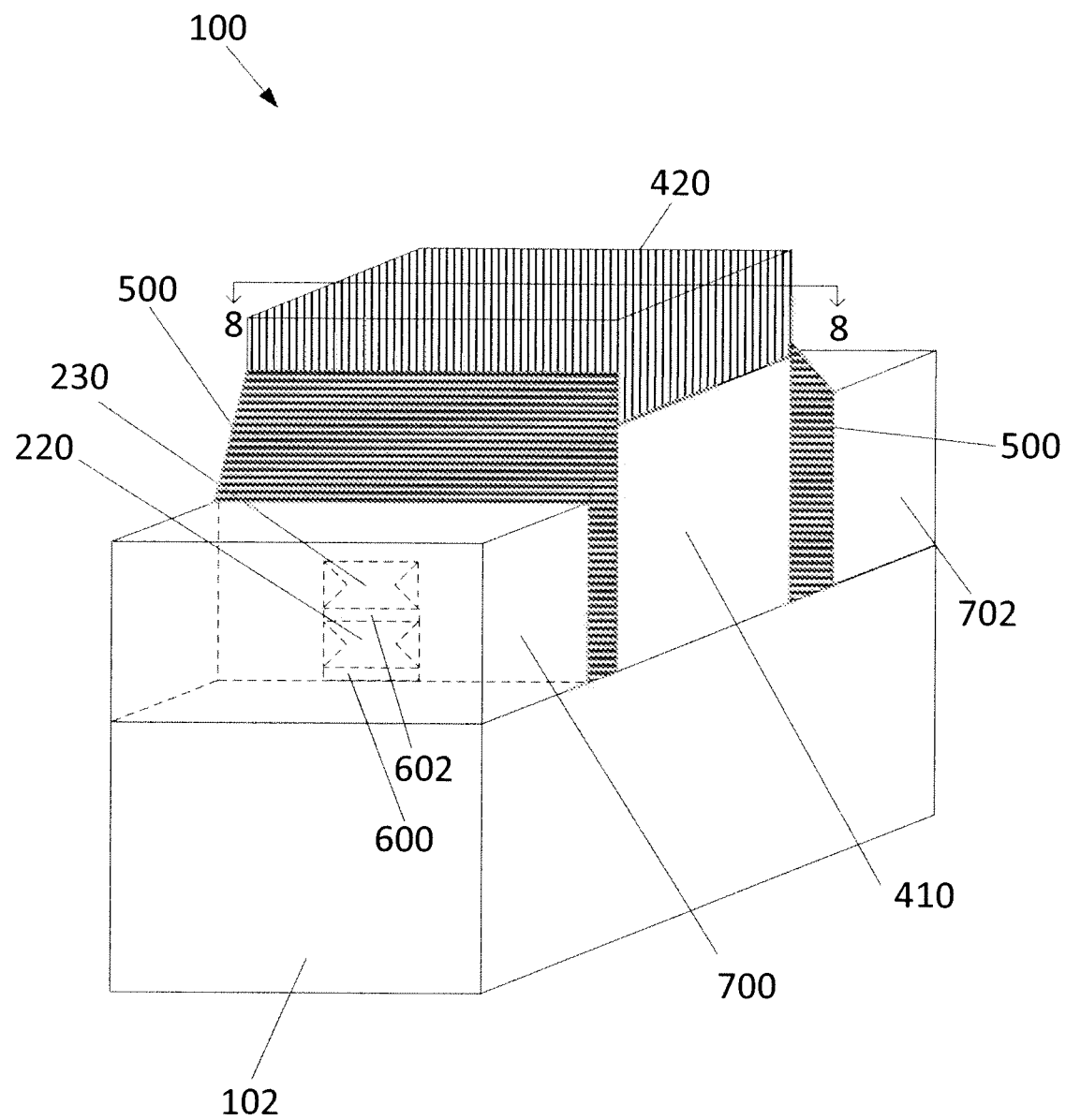
FIG. 7 illustrates forming a source region and a drain region associated with forming a semiconductor device, according to an embodiment.

FIG. 7 is a perspective view illustrating the semiconductor device 100, according to some embodiments. In an embodiment, a source region 700 and a drain region 702 are formed. The source region 700 and drain region 702 are formed in any number of ways. According to some embodiments, the source region 700 and drain region 702 are epitaxially grown from the substrate 102. In some embodiments, the source region 700 comprises a silicon material. In some embodiments, the drain region 702 comprises a silicon material. According to some embodiments, the source region 700 merges with the first channel 220 and the second channel 230. According to some embodiments, the drain region 702 merges with the first channel 220 and the second channel 230.

Figure 8:
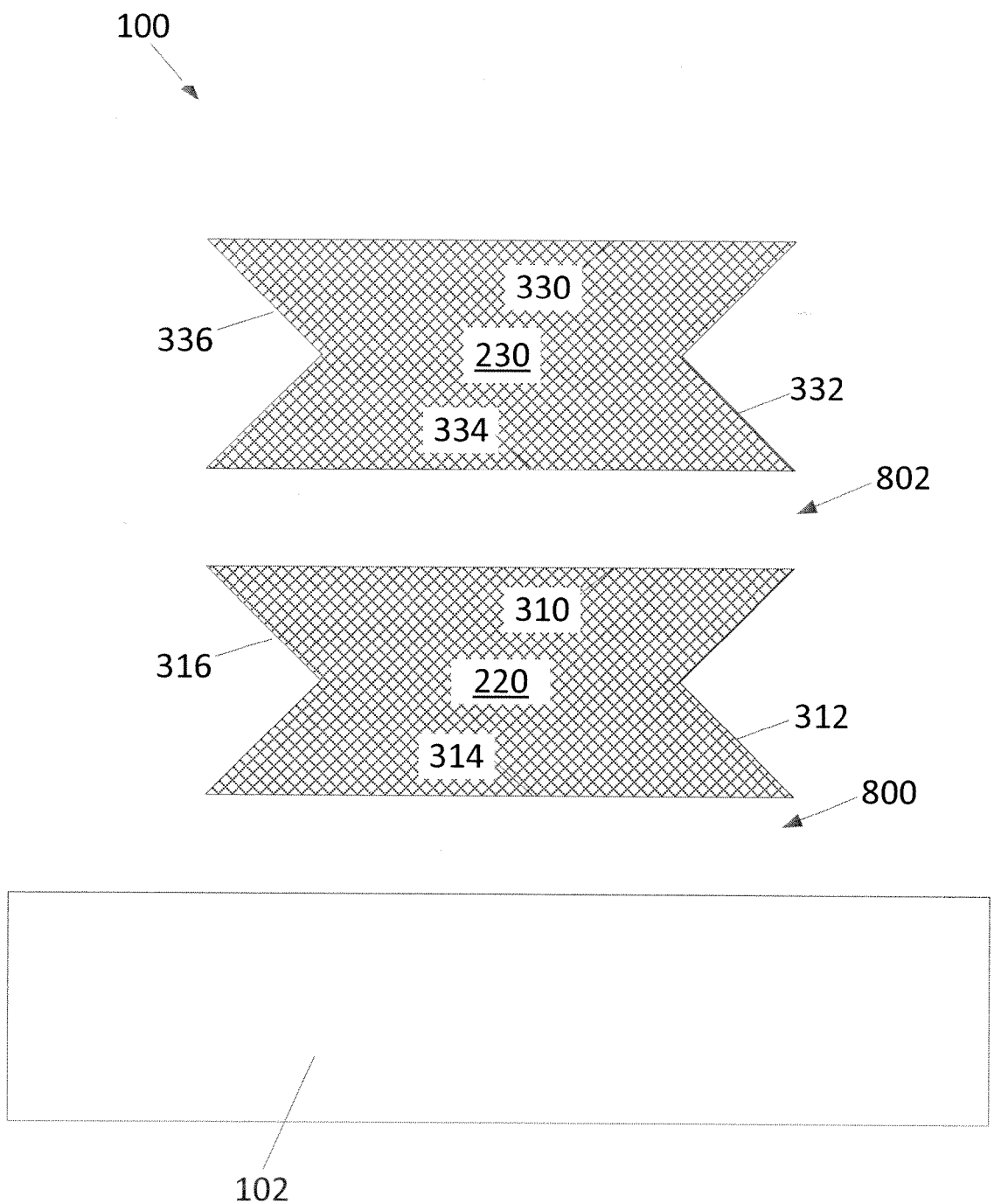
FIG. 8 illustrates a portion of a semiconductor device, according to an embodiment.

FIG. 8 is a sectional view illustrating the embodiment of FIG. 7 along line 8-8 after the dielectric layer 400, polysilicon layer 410, the mask layer 420, the first spacer layer 600, and second spacer layer 602 are removed from the semiconductor device 100 between the source region 700 and the drain region 702. The dielectric layer 400, polysilicon layer 410, the mask layer 420, the first spacer layer 600, and second spacer layer 602 are removed in any number of ways, such as by wet etching, for example. In an embodiment, a first opening 800 is formed between the first channel 220 and the substrate 102. In an embodiment, a second opening 802 is formed between the first channel 220 and the second channel 230.

Figure 9:
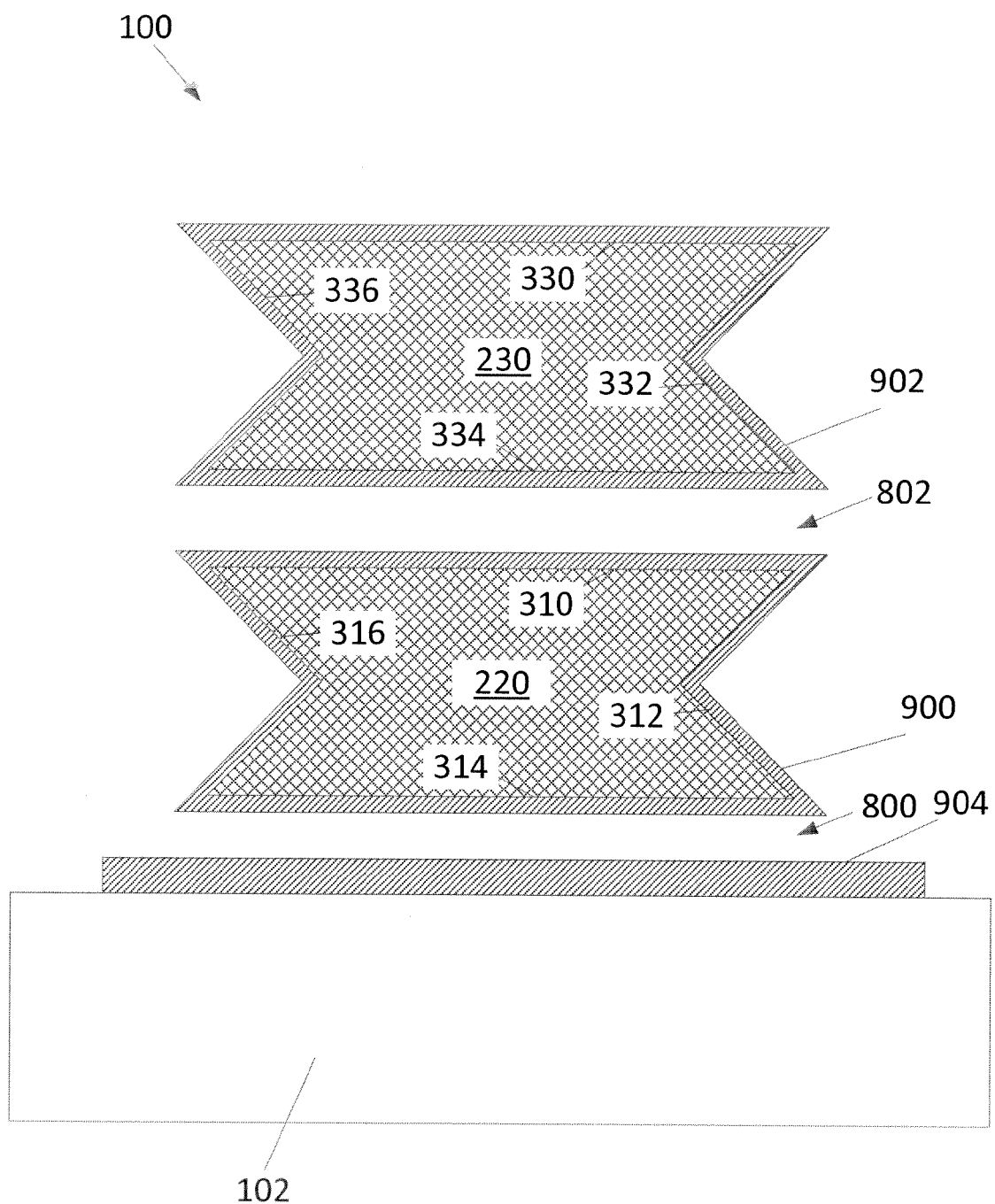
FIG. 9 illustrates forming a first dielectric region and a second dielectric region associated with forming a semiconductor device, according to an embodiment.

Turning to FIG. 9, in some embodiments, a first dielectric region 900 is formed to surround the first channel 220. In some embodiments, the first dielectric region 900 covers the first linear surface 310, the first non-linear surface 312, the second linear surface 314, and the second non-linear surface 316. In some embodiments, the first dielectric region 900 extends through the first opening 800 and the second opening 802 into and out of the page to the source region 700 and the drain region 702. In an embodiment, the first dielectric region 900 comprises a dielectric material with a relatively high dielectric constant, such as hafnium silicate, zirconium silicate, hafnium dioxide, and zirconium dioxide. In some embodiments, the first dielectric region 900 comprises a standard dielectric material with a medium dielectric constant, such as $SiO_2$. The first dielectric region 900 is formed in any number of ways, such as by atomic layer deposition (ALD), chemical vapor deposition (CVD), etc.

In some embodiments, a second dielectric region 902 is formed to surround the second channel 230. In some embodiments, the second dielectric region 902 covers the third linear surface 330, the third non-linear surface 332, the fourth linear surface 334, and the fourth non-linear surface 336. In some embodiments, the second dielectric region 902 extends through the second opening 802 into and out of the page to the source region 700 and the drain region 702. In an embodiment, the second dielectric region 902 comprises a dielectric material with a relatively high dielectric constant, such as hafnium silicate, zirconium silicate, hafnium dioxide, and zirconium dioxide. In some embodiments, the second dielectric region 902 comprises a standard dielectric material with a medium dielectric constant, such as $SiO_2$. The second dielectric region 902 is formed in any number of ways, such as by atomic layer deposition (ALD), chemical vapor deposition (CVD), etc.

In some embodiments, a third dielectric region 904 is formed in the first opening 800. In an embodiment, the third dielectric region 904 covers the substrate 102. In some embodiments, the third dielectric region 904 extends generally linearly parallel with respect to the second linear surface 314. In some embodiments, the third dielectric region 904 is spaced a distance apart from the first dielectric region 900 such that the first opening 800 exists between the third dielectric region 904 and the first dielectric region 900. In an embodiment, the third dielectric region 904 comprises a dielectric material with a relatively high dielectric constant, such as hafnium silicate, zirconium silicate, hafnium dioxide, and zirconium dioxide. In some embodiments, the third dielectric region 904 comprises a standard dielectric material with a medium dielectric constant, such as $SiO_2$. The third dielectric region 904 is formed in any number of ways, such as by atomic layer deposition (ALD), chemical vapor deposition (CVD), etc.

Figure 10:
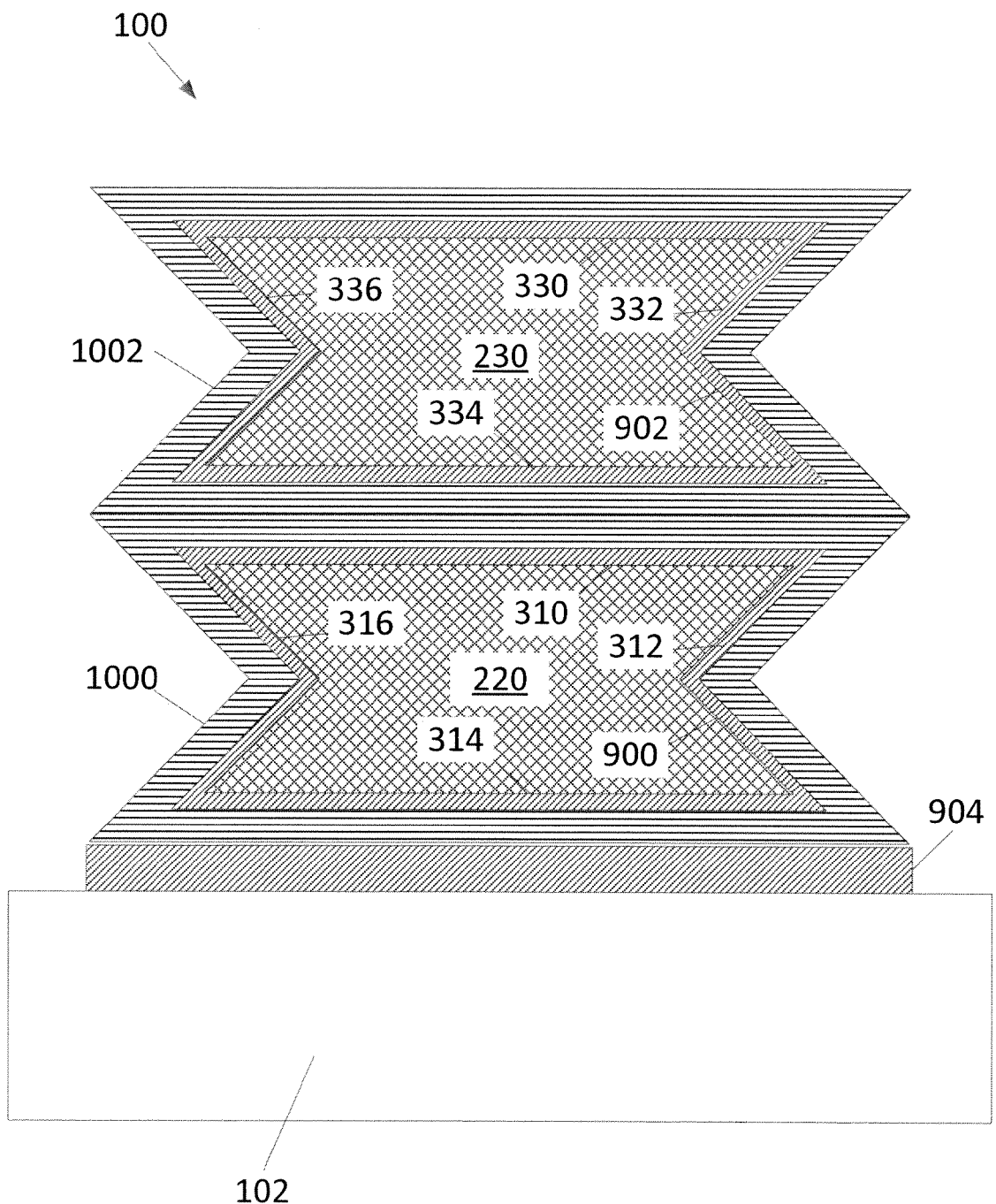
FIG. 10 illustrates forming a first work function region and a second work function region associated with forming a semiconductor device, according to an embodiment.

Turning to FIG. 10, in some embodiments, a first work function region 1000 is formed to surround the first channel 220. In an embodiment, the first work function region 1000 surrounds the first dielectric region 900. In some embodiments, the first work function region 1000 extends through the first opening 800 (illustrated in FIG. 9) and the second opening 802 (illustrated in FIG. 9). In an embodiment, the first work function region 1000 comprises a p or n-type work function metal. In an embodiment, the first work function region 1000 comprises an n-type work function metal. In some embodiments, the first work function region 1000 is formed by atomic layer deposition (ALD), chemical vapor deposition (CVD), etc., or other suitable processes.

In some embodiments, a second work function region 1002 is formed to surround the second channel 230. In an embodiment, the second work function region 1002 surrounds the second dielectric region 902. In some embodiments, the second work function region 1002 extends through the second opening 802 (illustrated in FIG. 9). In an embodiment, the second work function region 1002 comprises a p-or n-type work function metal. In an embodiment, the second work function region 1002 comprises an n-type work function metal. In some embodiments, the second work function region 1002 is formed by atomic layer deposition (ALD), chemical vapor deposition (CVD), etc., or other suitable processes.

Figure 11:
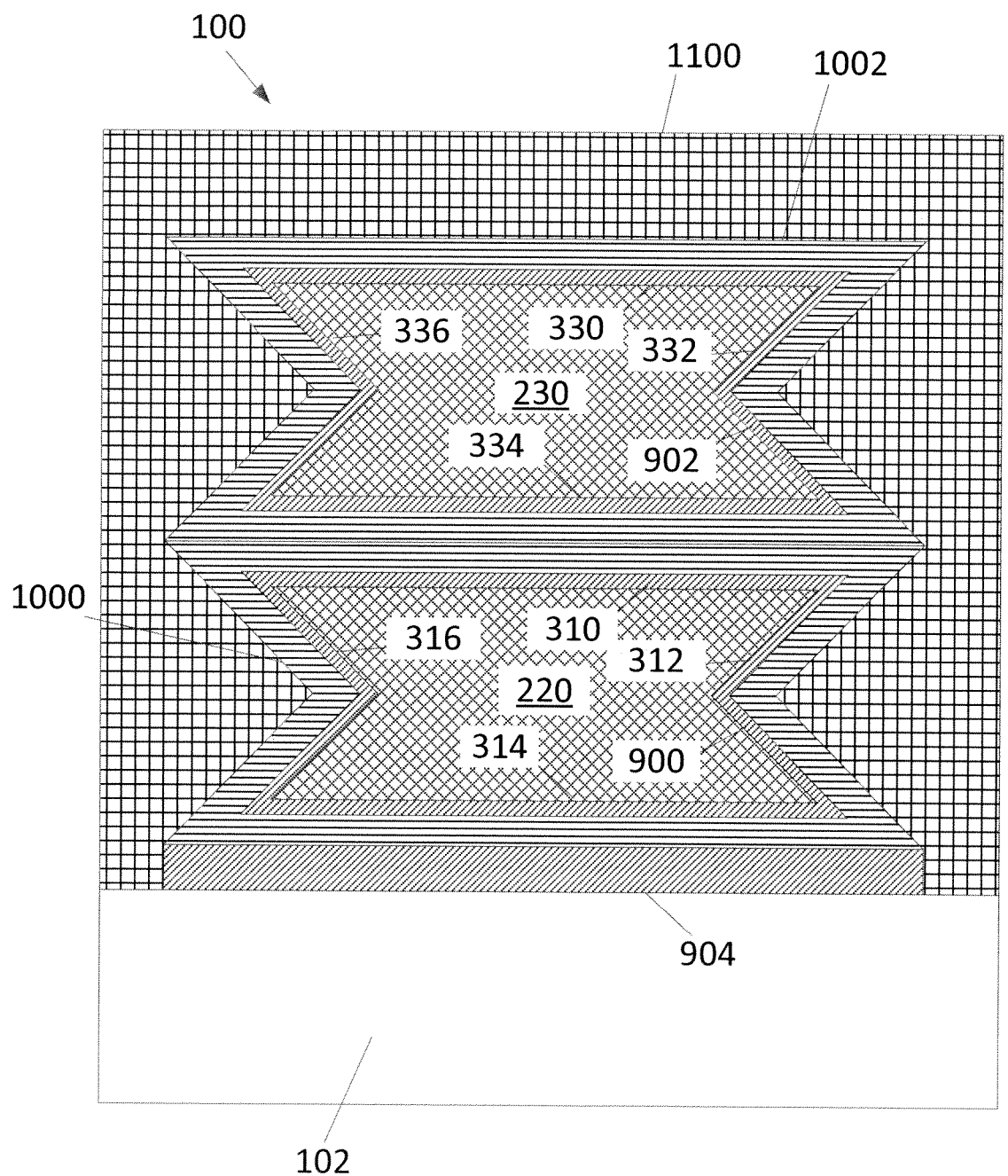
FIG. 11 illustrates forming a gate electrode associated with forming a semiconductor device, according to an embodiment.
Figure 12:
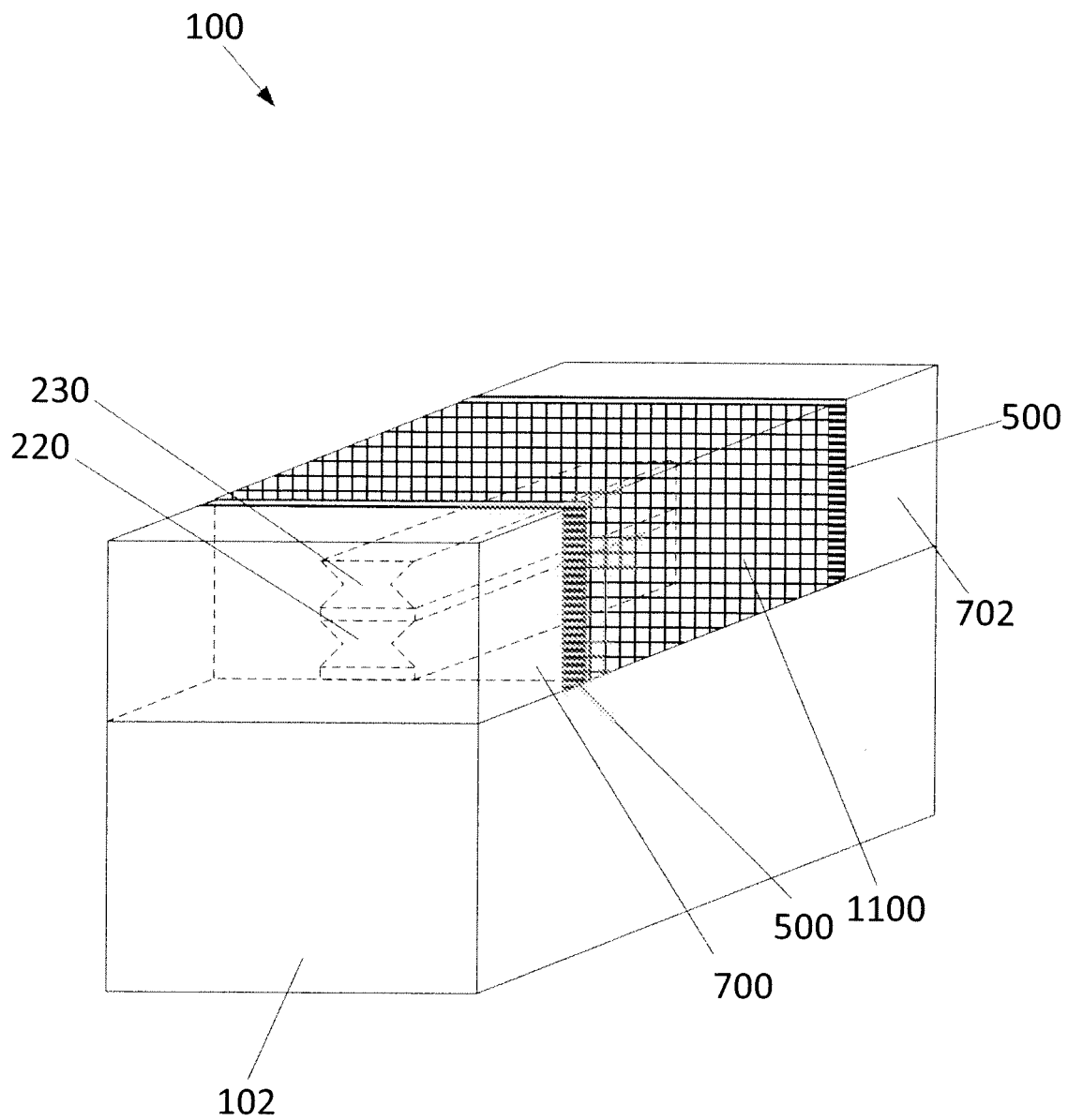
FIG. 12 illustrates a semiconductor device, according to an embodiment.

FIG. 11 illustrates the formation of a gate electrode 1100, and FIG. 12 is a perspective view illustrating the semiconductor device 100 comprising the gate electrode 1100. In some embodiments, the gate electrode 1100 surrounds the first work function region 1000 and the second function region 1002, such that the semiconductor device 100 comprises a gate-all-around (GAA) structure, or at least a partial GAA given that the gate electrode 1100 is not formed between the first channel 220 and the second channel 230. Accordingly, although a gate electrode is, at times, regarded as surrounding one or more regions herein, the gate electrode does not completely surround those regions in some embodiments. According to some embodiments, the first work function region 1000 is disposed between the first dielectric region 900 and the gate electrode 1100. According to some embodiments, the second work function region 1002 is disposed between the second dielectric region 902 and the gate electrode 1100. The gate electrode 1100 is formed in any number of ways, such as by deposition, epitaxial growth, etc., for example. In some embodiments, the gate electrode 1100 includes a conductive material, such as aluminum, copper, tungsten, etc., alone or in combination. In an embodiment, the semiconductor device 100 comprises more than one channel region, where at least some of the channel regions are formed as described herein to have a non-linear surface. In an embodiment, the semiconductor device 100 comprises more than two stacked channel regions.

In an embodiment, the GAA structure is capable of exerting or exercising more control over the first channel 220 and the second channel 230, or rather more control over current flow through the first channel 220 and the second channel 230 between the source region 700 and the drain region 702, as compared to a gate region formed merely on one side of the semiconductor device, such as merely above the third linear surface 330, for example. In some embodiments, the semiconductor device 100, comprising the GAA structure, has better control over on and off states. According to some embodiments, the first channel 220 comprises a {111} surface crystal orientation, such as at least one of the first non-linear surface 312 or the second non-linear surface 316, such that mobility through the first channel 220 is improved. According to some embodiments, the second channel 230 comprises a {111} surface crystal orientation, such as at least one of the third non-linear surface 332 or the fourth non-linear surface 336, such that mobility through the second channel 230 is improved.

Figure 13:
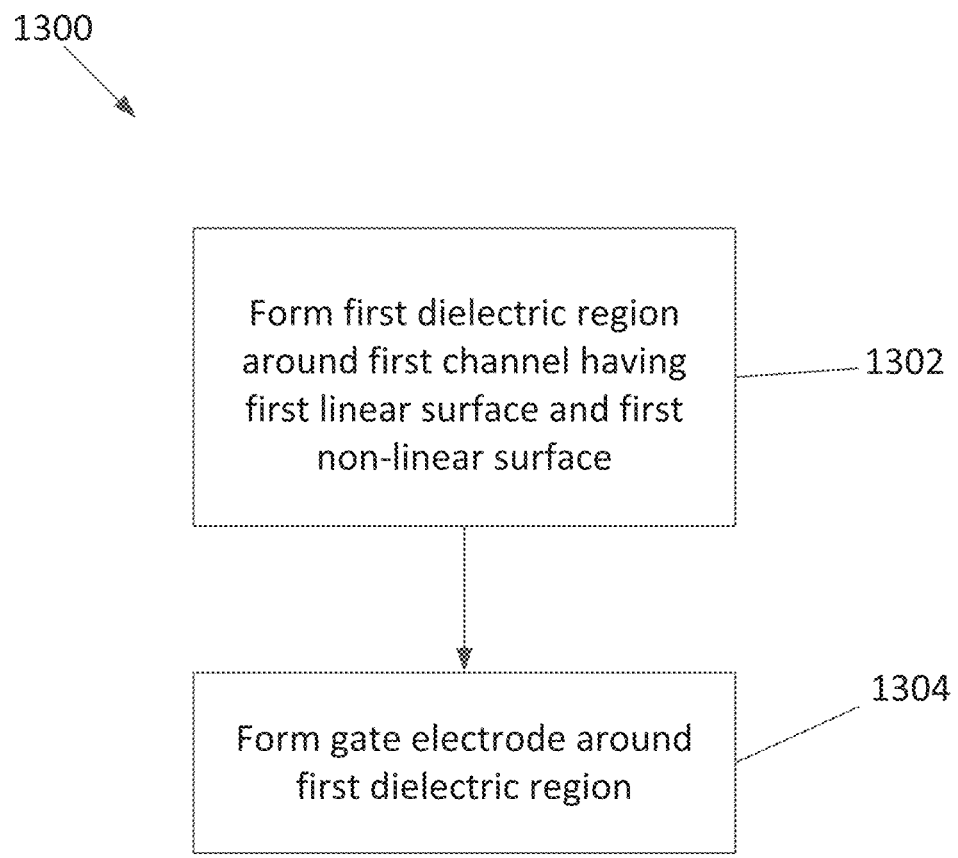
FIG. 13 illustrates a method of forming a semiconductor device, according to an embodiment.

An example method 1300 of forming a semiconductor device, such as semiconductor device 100, according to some embodiments, is illustrated in FIG. 13. At 1302, the first dielectric region 900 is formed around the first channel 220 having the first linear surface 310 and the first non-linear surface 312. At 1304, the gate electrode 1100 is formed around the first dielectric region 900.

In an embodiment, a semiconductor device comprises a first channel having a first linear surface and a first non-linear surface. In an embodiment, the semiconductor device comprises a first dielectric region surrounding the first channel. In an embodiment, the semiconductor device comprises a second channel having a third linear surface and a third non-linear surface. In an embodiment, the semiconductor device comprises a second dielectric region surrounding the second channel. In an embodiment, the semiconductor device comprises a gate electrode surrounding the first dielectric region and the second dielectric region.

In an embodiment, the semiconductor device comprises a first channel having a first linear surface and a first non-linear surface. In an embodiment, the semiconductor device comprises a first dielectric region surrounding the first channel. In an embodiment, the semiconductor device comprises a gate electrode surrounding the first dielectric region.

In an embodiment, a method of forming a semiconductor device comprises forming a first dielectric region around a first channel having a first linear surface and a first non-linear surface. In an embodiment, the method comprises forming a gate electrode around the first dielectric region.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more"

unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a first channel disposed over a substrate and having a first linear surface and a first non-linear surface, wherein the first non-linear surface defines a first angle relative to the first linear surface and a second angle relative to a second linear surface of the first channel, the first angle about 40 degrees to about 50 degrees, the second angle about 40 degrees to about 50 degrees;
   a first dielectric region surrounding the first channel;
   a second channel disposed over the first channel and having a third linear surface and a third non-linear surface;
   a second dielectric region surrounding the second channel; and
   a gate electrode surrounding the first dielectric region and the second dielectric region.

2. The semiconductor device of claim 1, wherein the first non-linear surface defines a first external angle of about 80 degrees to about 100 degrees.

3. The semiconductor device of claim 1, wherein the first non-linear surface and the first linear surface extend between a first source/drain region and a second source/drain region.

4. The semiconductor device of claim 1, wherein the first channel has a second non-linear surface, the second non-linear surface defining a second external angle of about 80 degrees to about 100 degrees.

5. The semiconductor device of claim 4, wherein the second non-linear surface is substantially diametrically opposed to the first non-linear surface.

6. The semiconductor device of claim 1, wherein the third non-linear surface defines a third external angle of about 80 degrees to about 100 degrees.

7. The semiconductor device of claim 1, wherein the third non-linear surface defines a fifth angle relative to the third linear surface and a sixth angle relative to a fourth linear surface of the second channel, the fifth angle about 40 degrees to about 50 degrees, the sixth angle about 40 degrees to about 50 degrees.

8. The semiconductor device of claim 1, wherein the second channel has a fourth non-linear surface, the fourth non-linear surface defining a fourth external angle of about 80 degrees to about 100 degrees.

9. The semiconductor device of claim 1, further comprising a first work function region disposed between the first dielectric region and the gate electrode and a second work function region disposed between the second dielectric region and the gate electrode.

10. The semiconductor device of claim 1, wherein the first linear surface is substantially parallel to the third linear surface.

11. The semiconductor device of claim 1, wherein the first non-linear surface comprises a {111} surface crystal orientation.

12. A semiconductor device, comprising:
    a gate stack comprising:
       a first channel having a first shape, the first shape comprising a first linear surface, a first non-linear surface, and a second non-linear surface, the second non-linear surface comprising a first portion and a second portion, the first portion abutting the second portion at a second external angle of about 80 degrees to about 100 degrees;
       a first dielectric region surrounding the first channel; and
       a gate electrode surrounding the first dielectric region; and
    a source/drain region having a second shape different than the first shape.

13. The semiconductor device of claim 12, wherein the first non-linear surface defines a first external angle of about 80 degrees to about 100 degrees.

14. The semiconductor device of claim 12, wherein the first non-linear surface defines a first angle relative to the first linear surface and a second angle relative to a second linear surface of the first channel, the first angle about 40 degrees to about 50 degrees, the second angle about 40 degrees to about 50 degrees.

15. The semiconductor device of claim 12, wherein the first linear surface, the first non-linear surface, and the second non-linear surface extend between a first source/drain region and a second source/drain region.

16. The semiconductor device of claim 12, wherein the second non-linear surface defines a third angle relative to the first linear surface and a fourth angle relative to a second linear surface of the first channel, the third angle about 40 degrees to about 50 degrees, the fourth angle about 40 degrees to about 50degrees.

17. The semiconductor device of claim 12, wherein the second non-linear surface is substantially diametrically opposed to the first non-linear surface.

18. A method of forming a semiconductor device, comprising:
    forming a first channel region;
    patterning the first channel region to form a first linear surface and a first non-linear surface;
    forming a spacer around a first portion of the first channel region;
    removing a second portion of the first channel region, around which the spacer is not formed, to form a first channel;
    forming a first dielectric region around the first channel, the first channel having the first linear surface and the first non-linear surface; and
    forming a gate electrode around the first dielectric region.

19. The method of claim 18, further comprising forming a second channel having a third linear surface and a third non-linear surface, the second channel above the first channel relative to a substrate upon which the first channel is formed.

20. The method of claim 19, further comprising forming a second dielectric region around the second channel.

* * * * *